(12) United States Patent
Jia et al.

(10) Patent No.: US 12,089,464 B2
(45) Date of Patent: Sep. 10, 2024

(54) ORGANIC LIGHT-EMITTING DISPLAY SUBSTRATE HAVING PARTITION GROOVES AND MANUFACTURING METHOD THEREOF, AND ORGANIC LIGHT-EMITTING DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Li Jia, Beijing (CN); Tao Gao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 674 days.

(21) Appl. No.: 17/269,118

(22) PCT Filed: Apr. 29, 2020

(86) PCT No.: PCT/CN2020/087912
§ 371 (c)(1),
(2) Date: Feb. 17, 2021

(87) PCT Pub. No.: WO2021/217526
PCT Pub. Date: Nov. 4, 2021

(65) Prior Publication Data
US 2022/0123099 A1    Apr. 21, 2022

(51) Int. Cl.
*H10K 59/173*    (2023.01)
*H10K 50/80*    (2023.01)
*H10K 71/00*    (2023.01)

(52) U.S. Cl.
CPC ........... *H10K 59/173* (2023.02); *H10K 50/80* (2023.02); *H10K 71/00* (2023.02)

(58) Field of Classification Search
CPC ...... H10K 59/173; H10K 50/80; H10K 71/00; H10K 50/865; H10K 59/122; H10K 59/65
See application file for complete search history.

(56) References Cited

U.S. PATENT DOCUMENTS 6,091,078 A * 7/2000 Codama ................. H05B 33/02
                                                          313/506
2007/0287298 A1* 12/2007 Ishibashi ........... H01L 21/31144
                                                        257/E21.038
(Continued)

FOREIGN PATENT DOCUMENTS

CN        104538423 A    4/2015
CN        107732019 A    2/2018
(Continued)

OTHER PUBLICATIONS

Japanese Patent Application No. 2021-569944, Notice of Reasons for Refusal, dated Jan. 4, 2024.

*Primary Examiner* — Kimberly N Rizkallah
*Assistant Examiner* — Zhijun Xu
(74) *Attorney, Agent, or Firm* — DINSMORE & SHOHL LLP

(57) ABSTRACT

Provided are an organic light-emitting display substrate and a manufacturing method thereof, and an organic light-emitting display device. The display substrate includes a substrate and an organic layer, an anode layer, an organic functional layer, and a cathode layer arranged sequentially on one side of the substrate. In a passive matrix organic light-emitting display area, the organic layer comprises a plurality of grooves spaced apart along a first direction and extending along a second direction, the anode layer com- (Continued)

prises a plurality of first anodes arranged in an array and a plurality of shielding portions. Each shielding portion partially overlaps with an orthographic projection of a groove on the substrate to form a partition groove. The cathode layer comprises a plurality of cathode strips and cathode material portions. Each cathode material portion is located within a partition groove and is not connected to an adjacent cathode strip.

20 Claims, 9 Drawing Sheets

(56) References Cited

U.S. PATENT DOCUMENTS

| | | |
|---|---|---|
| 2016/0181331 A1 | 6/2016 | Li et al. |
| 2017/0271421 A1 | 9/2017 | Jinbo et al. |
| 2020/0119304 A1 | 4/2020 | Choi et al. |
| 2020/0251539 A1 | 8/2020 | Fu |
| 2020/0328362 A1 | 10/2020 | Fan et al. |
| 2020/0343322 A1 | 10/2020 | Jia et al. |
| 2020/0350377 A1 | 11/2020 | Zhong et al. |
| 2023/0142157 A1* | 5/2023 | Liao .................. H01L 29/41791 257/368 |

FOREIGN PATENT DOCUMENTS

| | | | | |
|---|---|---|---|---|
| CN | 108269835 A | * | 7/2018 | ......... H01L 27/3241 |
| CN | 108717942 A | | 10/2018 | |
| CN | 109801950 A | | 5/2019 | |
| CN | 110047886 A | | 7/2019 | |
| CN | 110060578 A | | 7/2019 | |
| CN | 110690261 A | | 1/2020 | |
| CN | 111048551 A | | 4/2020 | |
| JP | H11307240 A | | 11/1999 | |
| JP | 2006126817 A | | 5/2006 | |
| JP | 2017174811 A | | 9/2017 | |
| KR | 20070003133 A | | 1/2007 | |

* cited by examiner

Enlarged at A

B-B

ORGANIC LIGHT-EMITTING DISPLAY SUBSTRATE HAVING PARTITION GROOVES AND MANUFACTURING METHOD THEREOF, AND ORGANIC LIGHT-EMITTING DISPLAY DEVICE

CROSS-REFERENCE TO RELATED APPLICATIONS

The present application is a U.S. National Stage Application under 35 U.S.C. § 371 of International Patent Application No. PCT/CN2020/087912, filed on Apr. 29, 2020, the disclosure of which is incorporated by reference herein in its entirety.

TECHNICAL FIELD

The present disclosure relates to an organic light-emitting display substrate and a manufacturing method thereof, and an organic light-emitting display device.

BACKGROUND

Due to a series of excellent characteristics such as self-luminescence, high contrast, wide viewing angle, low power consumption, fast response speed, and low manufacturing cost, the organic light-emitting device as a basis of a new-generation display device, has received more and more attention.

The production yield of the organic light-emitting display substrate is a problem that restricts large-scale application of the organic light-emitting display device.

SUMMARY

According to one aspect of the embodiments of the present disclosure, provided is an organic light-emitting display substrate comprising a passive matrix organic light-emitting display area. The organic light-emitting display substrate comprises: a substrate; an organic layer located on one side of the substrate, and comprising a plurality of grooves located at the passive matrix organic light-emitting display area, spaced apart along a first direction and extending along a second direction; an anode layer located on a surface of the organic layer away from the substrate, and comprising a plurality of first anodes located at the passive matrix organic light-emitting display area and arranged in an array, and a plurality of shielding portions located at the passive matrix organic light-emitting display area, spaced apart along the first direction and extending along the second direction, wherein orthographic projections of the plurality of shielding portions on the substrate and orthographic projections of the plurality of grooves on the substrate are distributed in gaps of orthographic projections of the plurality of first anodes on the substrate, which extend along the second direction, and an orthographic projection of each of the plurality of shielding portions on the substrate partially overlaps with an orthographic projection of a groove of the plurality of grooves on the substrate to form a partition groove; an organic functional layer formed on one side of the anode layer away from the substrate; and a cathode layer formed on one side of the organic functional layer away from the substrate, and comprising a plurality of cathode strips and a plurality of cathode material portions, wherein the plurality of cathode strips and the plurality of cathode material portions are located at the passive matrix organic light-emitting display area, extend along the second direction and are alternately arranged along the first direction, each of the plurality of cathode strips is further away from the substrate than the anode layer, and each of the plurality of cathode material portions is located within a partition groove and is not connected to an cathode strip of the plurality of cathode strips adjacent to the each of the plurality of cathode material portions.

In some embodiments, the organic functional layer comprises a plurality of first portions located at the passive matrix organic light-emitting display area and a plurality of second portions located at the passive matrix organic light-emitting display area, wherein each of the plurality of first portions is further away from the substrate than the anode layer, and each of the plurality of second portions is located within a partition groove and is not connected to a first portion of the plurality of first portions adjacent to the each of the plurality of second portions.

In some embodiments, each of the plurality of shielding portions comprises two shielding strips located on both sides of the groove and spaced apart from each other, and an orthographic projection of each of the two shielding strips on the substrate partially overlaps with the orthographic projection of the groove on the substrate.

In some embodiments, the organic light-emitting display substrate further comprises a first data metal layer, a first inorganic layer, a second data metal layer, a pixel defining layer and a spacer layer on the one side of the substrate, wherein: the organic layer comprises a first organic layer and a second organic layer; the first data metal layer, the first inorganic layer, the first organic layer, the second data metal layer, the second organic layer, the anode layer, the pixel defining layer, the spacer layer, the organic functional layer and the cathode layer are arranged sequentially along a direction away from the substrate; and in the passive matrix organic light-emitting display area, the second data metal layer is connected to the first data metal layer through a plurality of first via holes and connected to the anode layer through a plurality of second via holes, and any two of the plurality of first anodes adjacent to each other along the first direction are connected to each other through the first data metal layer or the second data metal layer.

In some embodiments, each of the plurality of grooves penetrates through the second organic layer and extends into the first organic layer.

In some embodiments, an orthographic projection of each of the plurality of grooves on the substrate has a width of 5 microns to 10 microns along the first direction.

In some embodiments, each of the plurality of grooves on the substrate has a depth of 2 micrometers to 2.5 micrometers along a direction perpendicular to the substrate.

In some embodiments, an angle between each of two side walls and a bottom wall of each of the plurality of grooves is 120 degrees to 140 degrees.

In some embodiments, a portion of the orthographic projection of each of the two shielding strips on the substrate overlapping with the orthographic projection of the groove on the substrate has a width of 0.8 micron to 1 micron along the first direction.

In some embodiments, the organic light-emitting display substrate further comprises an active matrix organic light-emitting display area, the organic light-emitting display substrate further comprising a semiconductor layer, a first insulating layer, a first gate metal layer, a second insulating layer, a second gate metal layer and a third insulating layer which are located between the substrate and the first data metal layer and arranged sequentially along the direction away from the substrate, wherein: in the active matrix organic light-emitting display area, the first data metal layer is connected to the semiconductor layer through a plurality of third via holes and connected to the second data metal layer through a plurality of fourth via holes, and the anode layer is connected to the second data metal layer through a plurality of fifth via holes.

In some embodiments, the active matrix organic light-emitting display area surrounds a portion of an edge of the passive matrix organic light-emitting display area; or the active matrix organic light-emitting display area surrounds the edge of the passive matrix organic light-emitting display area.

In some embodiments, the substrate comprises a first organic flexible layer, a second organic flexible layer, and a first inorganic barrier layer located between the first organic flexible layer and the second organic flexible layer.

According to another aspect of the embodiments of the present disclosure, provided is an organic light-emitting display device comprising the organic light-emitting display substrate according to any one of the above embodiments.

In some embodiments, the organic light-emitting display substrate further comprises an active matrix organic light-emitting display area; and the organic light-emitting display device further comprises at least one functional device, an orthographic projection of which on the organic light-emitting display substrate is located at the passive matrix organic light-emitting display area.

According to still another aspect of the embodiments of the present disclosure, provided is a manufacturing method of an organic light-emitting display substrate comprising a passive matrix organic light-emitting display area, the manufacturing method comprising: forming an organic layer on one side of a substrate; forming an anode layer on a surface of the organic layer away from the substrate, wherein the anode layer comprises a plurality of first anodes located at the passive matrix organic light-emitting display area and arranged in an array, and a plurality of shielding portions located at the passive matrix organic light-emitting display area, spaced apart along the first direction and extending along the second direction, wherein orthographic projections of the plurality of shielding portions on the substrate are distributed in gaps of orthographic projections of the plurality of first anodes on the substrate, which extend along the second direction; forming a pixel defining layer and a spacer layer sequentially on one side of the anode layer away from the substrate; etching the organic layer to form a plurality of grooves located at the passive matrix organic light-emitting display area, and extending along the second direction, wherein orthographic projections of the plurality of grooves on the substrate are distributed in gaps of orthographic projections of the plurality of first anodes on the substrate, which extend along the second direction, and an orthographic projection of each of the plurality of grooves on the substrate partially overlaps with an orthographic projection of a shielding portion of the plurality of shielding portions on the substrate to form a partition groove; and forming an organic functional layer and a cathode layer sequentially on one side of the spacer layer away from the substrate, wherein the cathode layer comprises a plurality of cathode strips and a plurality of cathode material portions, the plurality of cathode strips and the plurality of cathode material portions are located at the passive matrix organic light-emitting display area, extend along the second direction and are alternately arranged along the first direction, each of the plurality of cathode strips is further away from the substrate than the anode layer, and each of the plurality of cathode material portions is located within a partition groove and is not connected to an cathode strip of the plurality of cathode strips adjacent to the each of the plurality of cathode material portions.

In some embodiments, etching the organic layer comprises: forming a hard mask on the one side of the spacer layer away from the substrate, wherein an area of the hard mask corresponding to notch of the partition groove is hollow area; dry etching the organic layer through the hard mask to form the groove; and peeling off the hard mask.

In some embodiments, forming the hard mask comprises: forming a hard mask cover layer and a photoresist cover layer sequentially on the one side of the spacer layer away from the substrate; exposing and developing the photoresist cover layer sequentially to obtain a photoresist protection mask, wherein an area of the photoresist protection mask corresponding to the notch of the partition groove is hollow area; and wet etching the hard mask cover layer through the photoresist protective mask to obtain the hard mask.

In some embodiments, a material of the hard mask comprises metal oxide.

In some embodiments, a material of the hard mask comprises indium gallium zinc oxide.

In some embodiments, forming the organic layer comprises forming a first organic layer and a second organic layer sequentially on the one side of the substrate, and the manufacturing method further comprises: forming a first data metal layer and a first inorganic layer sequentially on the one side of the substrate before forming the first organic layer; and forming a second data metal layer on one side of the first organic layer away from the substrate after forming the first organic layer and before forming the second organic layer, wherein in the passive matrix organic light-emitting display area, the second data metal layer is connected to the first data metal layer through a plurality of first via holes and connected to the anode layer through a plurality of second via holes, and any two of the plurality of first anodes adjacent to each other along the first direction are connected to each other through the first data metal layer or the second data metal layer.

In some embodiments, each of the plurality of grooves penetrates through the second organic layer and extends into the first organic layer.

In some embodiments, the organic light-emitting display substrate further comprises an active matrix organic light-emitting display area, and the manufacturing method further comprises: forming a semiconductor layer, a first insulating layer, a first gate metal layer, a second insulating layer, a second gate metal layer, and a third insulating layer sequentially on the one side of the substrate before forming the first data metal layer, wherein in the active matrix organic light-emitting display area, the first data metal layer is connected to the semiconductor layer through a plurality of third via holes and connected to the second data metal layer through a plurality of fourth via holes, and the anode layer is connected to the second data metal layer through a plurality of fifth via holes.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
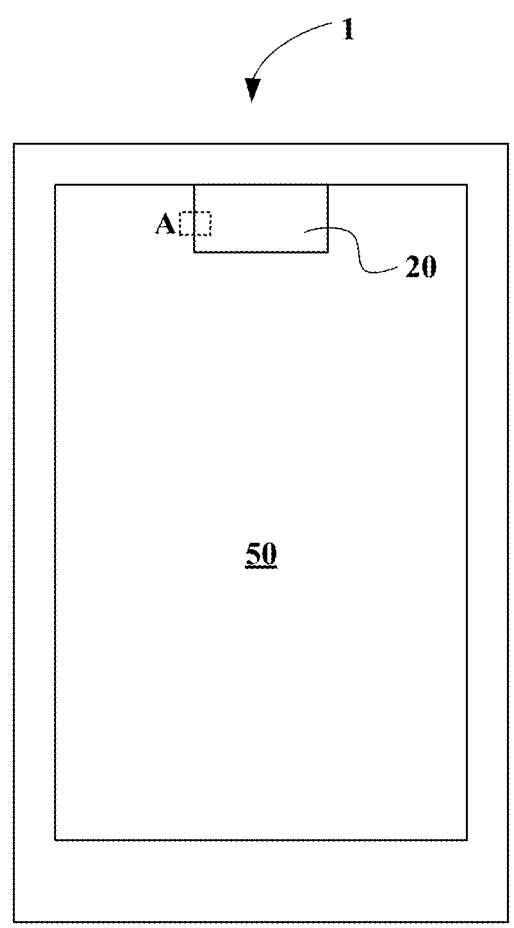
FIG. 1a is a front view showing an organic light-emitting display substrate according to an embodiment of the present disclosure.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

With the characteristics of small weight, small thicknesses and flexibility, the organic light-emitting display substrate is widely applied in a flexible display device. In order to improve the production yield of the organic light-emitting display substrate, the embodiments of the present disclosure provide an organic light-emitting display substrate and a manufacturing method thereof, and an organic light-emitting display device.

Figure 1B:
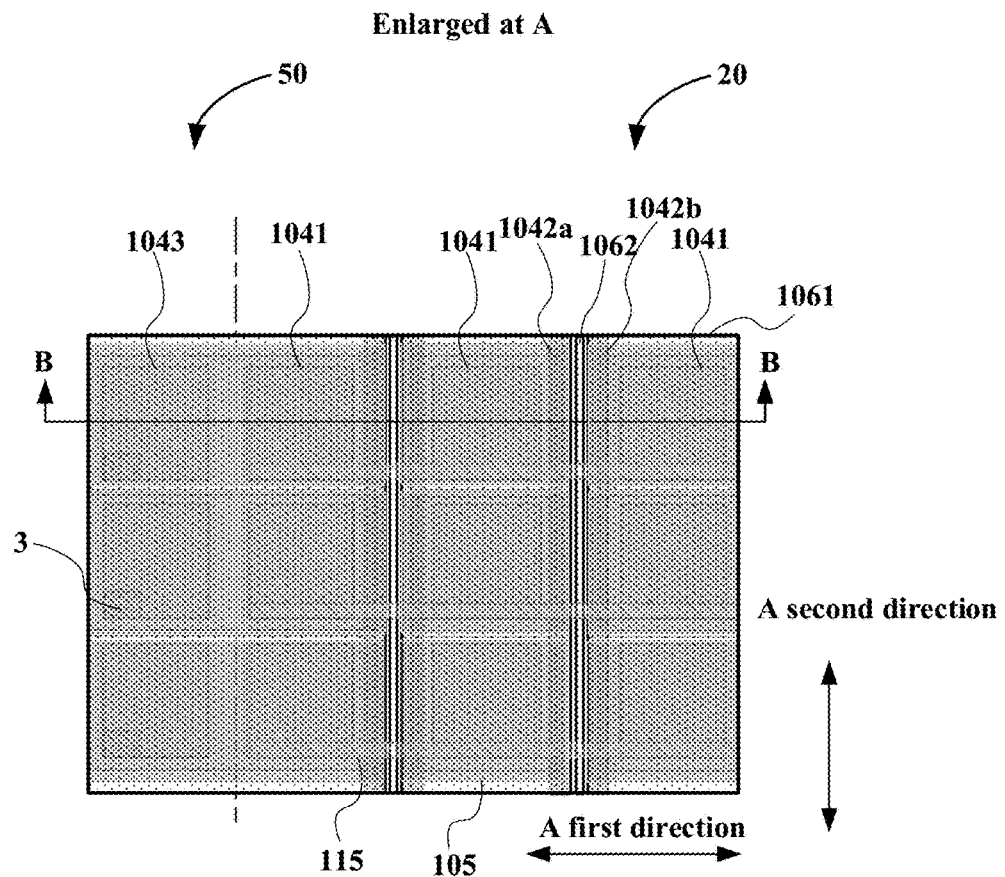
FIG. 1b is an enlarged schematic view showing an organic light-emitting display substrate at A in FIG. 1a according to an embodiment of the present disclosure.
Figure 1C:
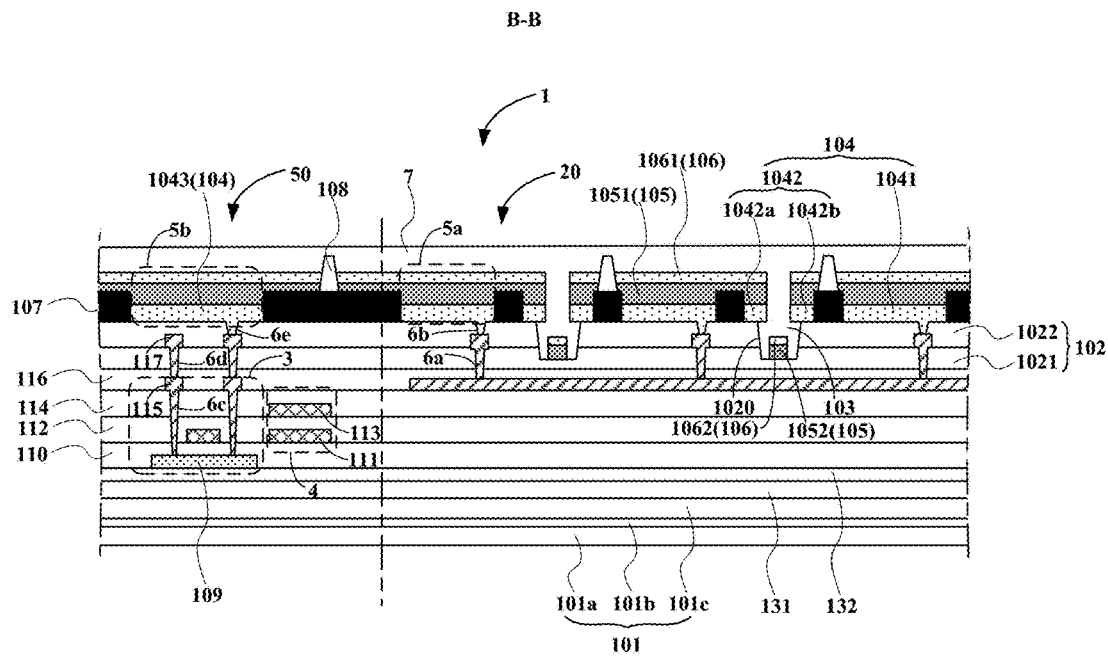
FIG. 1c is a schematic cross-sectional view showing an organic light-emitting display substrate at B-B in FIG. 1b according to an embodiment of the present disclosure.

As shown in FIG. 1a, the organic light-emitting display substrate 1 provided by an embodiment of the present disclosure comprises a passive matrix organic light-emitting display area 20. FIG. 1b is an enlarged schematic view showing an organic light-emitting display substrate at A in FIG. 1a according to an embodiment of the present disclosure. The structure of a light shielding matrix is not shown by omission in FIG. 1b. FIG. 1c is a schematic cross-sectional view showing an organic light-emitting display substrate at B-B in FIG. 1b according to an embodiment of the present disclosure.

As shown in FIGS. 1b and 1c, the organic light-emitting display substrate 1 provided by the embodiments of the present disclosure comprises a substrate 101, an organic layer 102, an anode layer 104, an organic functional layer 105, and a cathode layer 106.

The organic layer 102 is located on one side of the substrate 101 and comprising a plurality of grooves 1020 located at the passive matrix organic light-emitting display area 20. The plurality of grooves 1020 are spaced apart along a first direction and extend along a second direction.

The anode layer 104 is located on a surface of the organic layer 102 away from the substrate 101. The anode layer 104 comprises a plurality of first anodes 1041 located at the passive matrix organic light-emitting display area 20 and arranged in an array. The anode layer 104 further comprises a plurality of shielding portions 1042 located at the passive matrix organic light-emitting display area 20, spaced apart along the first direction and extending along the second direction. The orthographic projections of the plurality of shielding portions 1042 on the substrate 101 and the orthographic projections of the plurality of grooves 1020 on the substrate 101 are distributed in gaps of orthographic projections of a plurality of first anodes 1041 on the substrate 101. The gaps extend along the second direction. The orthographic projection of each shielding portion 1042 on the substrate 101 partially overlaps with the orthographic projection of a groove 1020 on the substrate 101 to form a partition groove 103.

The organic functional layer 105 is formed on one side of the anode layer 104 away from the substrate 101.

The cathode layer 106 is formed on one side of the organic functional layer 105 away from the substrate 101. The cathode layer 106 comprises a plurality of cathode strips 1061 located at the passive matrix organic light-emitting display area 20 and a plurality of cathode material portions 1062 located at the passive matrix organic light-emitting display area 20. The plurality of cathode strips 1061 and the plurality of cathode material portions 1062 extend along the second direction and are alternately arranged along the first direction. Each cathode strip 1061 is further away from the substrate 101 than the anode layer 104. Each cathode material portion 1062 is located within a partition groove 103 and is not connected to a cathode strip 1061 which is adjacent to this cathode material portion 1062.

In the embodiments of the present disclosure, the organic functional layer 105 is formed on one side of the anode layer 104 away from the substrate 101. It should be understood that the entire pattern layer of the organic functional layer 105 which is located on one side of entire pattern layer of the anode layer 104 away from the substrate 101, should not be understood as an absolute positional relationship of a partial structure. The positional relationships between other pattern layers which are similar to this will not be described in detail here.

As shown in FIG. 1c, in some embodiments of the present disclosure, the organic functional layer 105 comprises a plurality of first portions 1051 located at the passive matrix organic light-emitting display area 20 and a plurality of second portions 1052 located at the passive matrix organic light-emitting display area 20. Each first portion 1051 is further away from the substrate 101 than the anode layer 104. Each second portion 1052 is located within a partition groove 103 and is not connected to a first portion 1051 which is adjacent to this second portion 1052.

In the embodiments of the present disclosure, the first direction and the second direction are not specifically limited. For example, in some embodiments, the first direction is a row direction, and the second direction is a column direction. In other embodiments, the first direction is a column direction, and the second direction is a row direction.

The passive matrix organic light-emitting display area 20 of the organic light-emitting display substrate 1 comprises a plurality of passive matrix organic light-emitting diodes (PMOLED) arranged in an array, which are illuminated in a scanned manner. Each organic light-emitting device 5a emits light instantly under a short pulse. In the embodiment shown in FIG. 1a, the organic light-emitting display substrate 1 further comprises an active matrix organic light-emitting display area 50. As shown in FIG. 1c, the active matrix organic light-emitting display area 50 comprises a plurality of active-matrix organic light-emitting diodes 5b (AMOLED) arranged in an array. Each organic light-emitting device 5b is controlled by a thin film transistor device 3 and emit light independently and continuously.

Figure 2:
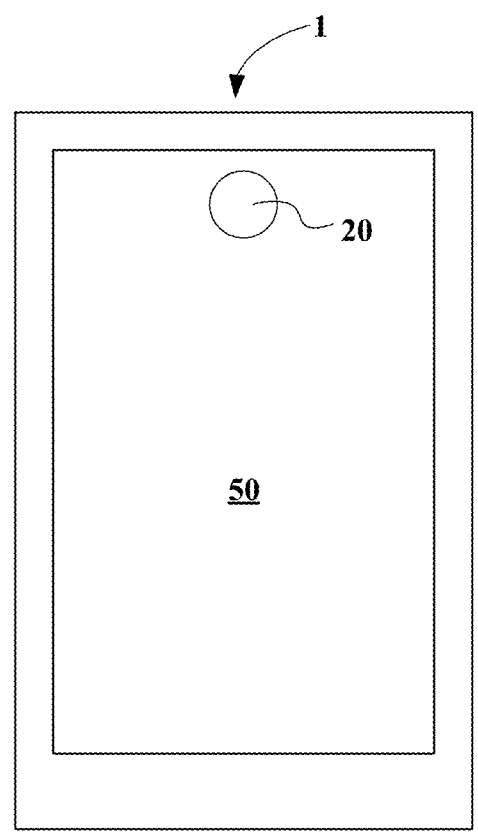
FIG. 2 is a front view showing an organic light-emitting display substrate according to another embodiment of the present disclosure.

The shape of the passive matrix organic light-emitting display area 20 is not limited, for example, is circular, oval, rectangular or polygonal, and the like. The passive matrix organic light-emitting display area 20 is not required to be provided with a thin film transistor device, and thus has a relatively high transmittance. In the organic light-emitting display device, a functional device such as a camera or a distance sensor may be disposed on a back side of the organic light-emitting display substrate 1 and opposite to the passive matrix organic light-emitting display area 20, so that light can pass through the passive matrix organic light-emitting display area 20 to be incident on the functional device. Such a design is favorable for increasing a screen-to-body ratio of the organic light-emitting display device, and more suitable for a narrow frame and an ultra-narrow frame. In the embodiment shown in FIG. 1a, the active matrix organic light-emitting display area 50 is arranged surrounding a portion of the edge of the passive matrix organic light-emitting display area 20. In the embodiment shown in FIG. 2, the active matrix organic light-emitting display area 50 may also surround the entire edge of the passive matrix organic light-emitting display area 20.

In some embodiments of the present disclosure, the organic light-emitting display substrate may also be a passive matrix organic light-emitting display substrate, and the display area of the organic light-emitting display substrate only comprises the passive matrix organic light-emitting display area.

As shown in FIG. 1c, in some embodiments, the organic layer 102 comprises a first organic layer 1021 and a second organic layer 1022 serving as planarization layers. The groove 1020 penetrates through the second organic layer 1022 and extends into the first organic layer 1021. The structure of the organic light-emitting display substrate 1 further comprises a second inorganic barrier layer 131, a buffer layer 132, a semiconductor layer 109, a first insulating layer 110, a first insulating layer 110, a first gate metal layer 111, a second insulating layer 112, a second gate metal layer 113, a third insulating layer 114, a first data metal layer 115, a first inorganic layer 116, a second data metal layer 117, a pixel defining layer 107 and a spacer layer 108 located on one side of the substrate 101 and arranged sequentially along a direction away from the substrate 101. The first organic layer 1021 is located between the first inorganic layer 116 and the second data metal layer 117, and the second organic layer 1022 is located between the second data metal layer 117 and the anode layer 104. The organic functional layer 105 is located on one side of the spacer layer 108 away from the substrate 101. In the passive matrix organic light-emitting display area 20, the second data metal layer 117 is connected to the first data metal layer 115 through a plurality of first via holes 6a, and connected to the anode layer 104 through a plurality of second via holes 6b.

In the passive matrix organic light-emitting display area 20, any two first anodes 1041 adjacent to each other along the first direction are connected to each other through the first data metal layer 115. That is, the plurality of first anodes 1041 arranged along the first direction are electrically conductive through the first data metal layer 115, so that the organic light-emitting devices 5a arranged in a matrix can be illuminated in a scanned manner. In other embodiments of the present disclosure, any two first anodes 1041 adjacent to each other along the first direction may also be connected to each other through the second data metal layer 117.

In the active matrix organic light-emitting display area 50, the first data metal layer 115 is connected to the semiconductor layer 109 through a plurality of third via holes 6c, and connected to the second data metal layer 117 through a plurality of fourth via holes 6d. In addition, in order to implement encapsulated protection of the internal structure of the organic light-emitting display substrate 1, the organic light-emitting display substrate 1 further comprises a thin film encapsulation layer 7.

The semiconductor layer 109 comprises an active layer of the thin film transistor device 3, the first gate metal layer 111 comprises a gate of the thin film transistor device 3 and a first plate of the capacitor device 4, the second gate metal layer 113 comprises a second plate of the capacitor device 4, the first data metal layer 115 comprises a first layer of a trace as well as a source and drain of the thin film transistor device 3, and the second data metal layer 117 comprises a second layer of the trace. The double-layer trace design is equivalent to connection of resistors in parallel and may reduce the resistance of the trace and further reduce the power consumption of the organic light-emitting display substrate 1.

In the active matrix organic light-emitting display area 50, the anode layer 104 comprises a plurality of second anodes 1043 arranged in an array. The plurality of second anodes 1043 are connected to the second data metal layer 117 through a plurality of fifth via holes 6e. In the passive matrix organic light-emitting display area 20, the first anode 1041, a portion of the organic functional layer 105 directly opposite to the first anode 1041, and a portion of the cathode strip 1061 directly opposite to the first anode 1041 constitute an organic light-emitting device 5a. In the active matrix organic light-emitting display area 50, the second anode 1043, a portion of the organic functional layer 105 directly opposite to the second anode 1043, and a portion of the cathode layer 106 directly opposite to the second anode 1043 constitute an organic light-emitting device 5b.

In some embodiments, the organic functional layer 105 and the cathode layer 106 of the organic light-emitting display substrate 1 are formed using an evaporation process. During the evaporation process, the evaporation material gas forms a film layer substantially along a normal direction of the substrate 101. Therefore, the undercut structure of the partition groove 103 may obstruct the evaporation material gas from forming a film on a sidewall of the groove 1020, so that a portion of the film layer located within the partition groove 103 is not connected to a portion of the film layer located outside the partition groove 103. That is, the film layer cannot be continuous on both sides of the partition groove 103. In the embodiments of the present disclosure, in the passive matrix organic light-emitting display area 20, due to the partition effect of the partition groove 103, the plurality of cathode strips 1061 of the cathode layer 106 extend along the second direction and are spaced apart along the first direction. In the active matrix organic light-emitting display area 50, the cathode layer 106 may extend continuously. The organic functional layer 105 may be formed by evaporation over a large area or formed by patterned evaporation using a mask.

In some embodiments of the present disclosure, as shown in FIGS. 1b and 1c, the shielding portion 1042 comprises two shielding strips 1042a, 1042b located on both sides of the groove 1020 and spaced apart. The orthographic projection of each of the two shielding strips 1042a, 1042b on the substrate 101 partially overlaps with the orthographic projection of the groove 1020 on the substrate 101. In this way, the two shielding strips 1042a and 1042b may both obstruct the cathode material from forming a film on the two side walls of the groove 1020, thereby further ensuring that the adjacent cathode strips 1061 are partitioned by the partition groove 103.

The anode layer 104 is not limited to a specific material. In some embodiments, the anode layer 104 comprises a first indium tin oxide layer, a second indium tin oxide layer, and a silver layer sandwiched between the first indium tin oxide layer and the second indium tin oxide layer. The first indium tin oxide layer and the second indium tin oxide layer each has a thickness of 60 angstroms to 80 angstroms, for example 70 angstroms. The silver layer has a thickness of 800 angstroms to 1200 angstroms, for example 1000 angstroms. During the manufacturing of the anode layer 104, a film is formed first using a sputtering process, and then a pattern is formed by wet etching using a mask patterning process.

In some embodiments, the pattern of the organic layer 102 is formed by dry etching using a mask patterning process. Since the anode layer 104 pertains to an inorganic material which is very distinctive from the material of the organic layer 102, by dry etching the organic layer 102 by selecting a suitable selection ratio, an undercut structure is formed on one side of the two shielding strips 1042a, 1042b close to the substrate 101. That is, orthographic projections of the two shielding strips 1042a and 1042b on the substrate 101 partially overlap with the orthographic projection of the groove 1020 on the substrate 101. As shown in FIG. 1c, there is no gap between the orthographic projections of the two shielding strips 1042a, 1042b on the substrate 101 and the orthographic projection of the pixel defining layer 107 on the substrate 101. In other embodiments of the present disclosure, the orthographic projections of the two shielding strips on the substrate may also be spaced apart from or partially overlap with the orthographic projection of the pixel defining layer 107 on the substrate.

Figure 1D:
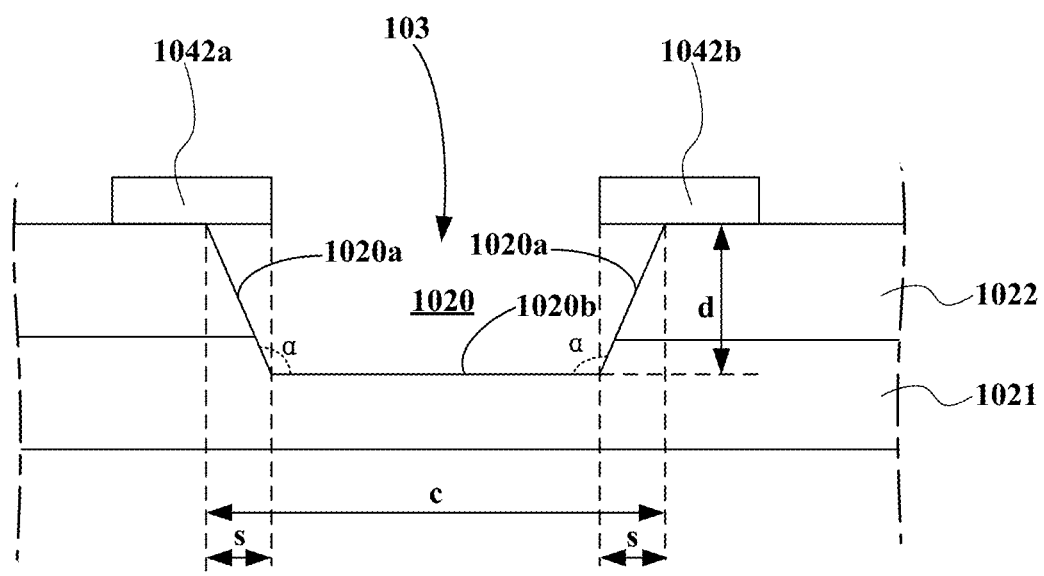
FIG. 1d is an enlarged schematic cross-sectional view showing a partition groove according to an embodiment of the present disclosure.

As shown in FIG. 1d, in some embodiments of the present disclosure, the width c of the orthographic projection of the groove 1020 on the substrate 101 along the first direction is 5 microns to 10 microns. The depth d of the groove 1020 along the direction perpendicular to the substrate 101 is 2 microns to 2.5 microns. The angle α between each of the two side walls 1020a and the bottom wall 1020b of the groove 1020 is 120° to 140°. The width S along the first direction of a portion of the orthographic projection of each of the shielding strips 1042a, 1042b on the substrate 101 overlapping with the orthographic projection of the corresponding groove 1020 on the substrate 101 is 0.8 micron to 1 micron. With the presence of the overlapped width S, the partition groove 103 has an undercut structure.

Figure 3A:
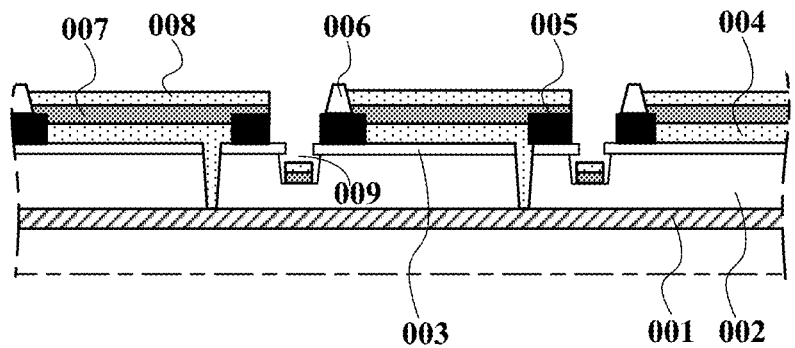
FIG. 3a is a schematic cross-sectional view showing a passive matrix organic light-emitting display area of an organic light-emitting display substrate in the related art.

In a related technology, as shown in FIG. 3a, the structure of the passive matrix organic light-emitting display area in the organic light-emitting display substrate comprises a data metal layer 001, an organic layer 002, an inorganic layer 003, and an anode layer 004, a pixel defining layer 005, a spacer layer 006, an organic functional layer 007, and a cathode layer 008 arranged sequentially along a direction away from a substrate. The anode layer 004 is connected to the data metal layer 001 through a via hole, and the structure of a plurality of partition grooves 009 is formed by both the organic layer 002 and the inorganic layer 003. The plurality of partition grooves 009 are configured to partition the cathode layer 008 to obtain a plurality of cathode strips spaced apart along a row direction and extending along a column direction. When the organic light-emitting display substrate is manufactured, the partition groove 009 is formed first, and then the anode layer 004 is formed, and afterwards, the pixel defining layer 005, the spacer layer 006, the organic functional layer 007 and the cathode layer 008 are formed sequentially. The related technology has the following technical defects.

I. The organic layer 002 may release gas in a high-temperature process environment. The inorganic layer 003 covers a large area of the organic layer 002, which might result in that bubbles are generated between the organic layer 002 and the inorganic layer 003.

II. The inorganic layer 003 is formed on the surface of the organic layer 002. When the inorganic layer 003 is etched, it is likely to damage the organic layer 002.

III. The organic layer 002 is usually used as a planarization layer. The inorganic layer 003 manufactured on the surface of the organic layer 002 has poor planarization and is used as a base surface for manufacturing the anode layer 004.

Figure 3B:
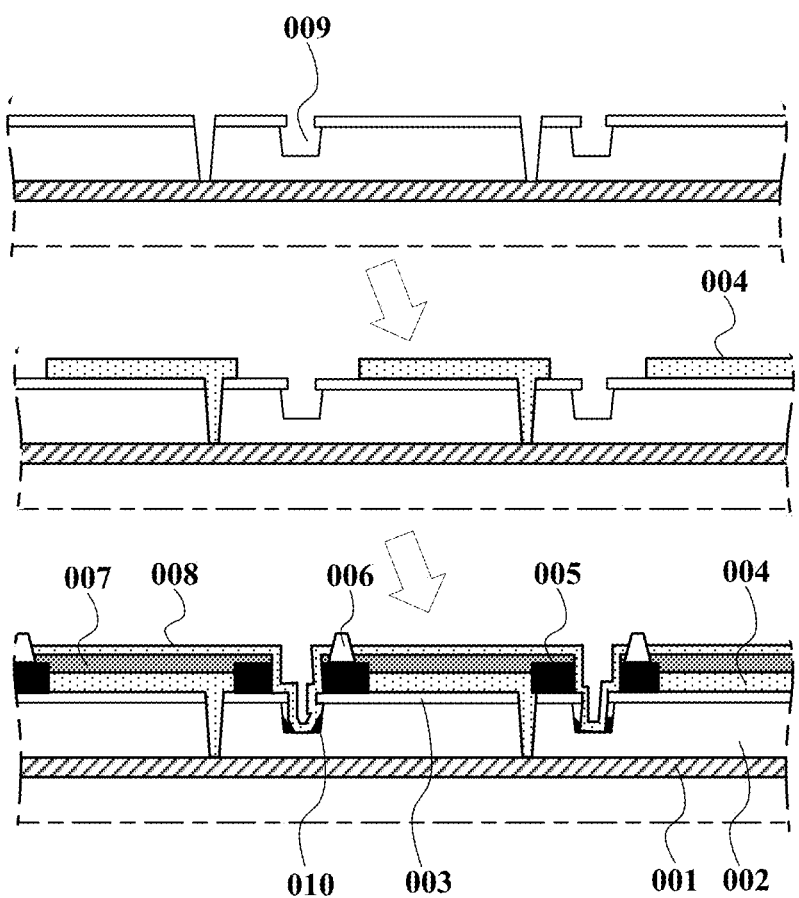
FIG. 3b shows some schematic cross-sectional views of a manufacturing process of an organic light-emitting display substrate in the related art.

IV. As shown in FIG. 3b, the manufacturing processes of the pixel defining layer 005 and the spacer layer 006 are performed after the manufacturing process of the partition groove 009 is completed. Thus, the manufacturing material 010 of the pixel defining layer and/or the spacer layer is likely to remain in the partition groove 009, a failure of the partition effect of the partition groove 009 is further resulted in, and the cathode strips cannot be effectively partitioned.

V. The manufacturing process of the anode layer 004 is performed after the manufacturing process of the partition groove 009. During the process of forming the anode layer 004 using a mask patterning process, bubbles might be generated between the photoresist layer and the inner wall of the partition groove 009. The explosion of the bubbles may have a bad effect on subsequent process.

The above technical defects have seriously affected the production yield of the organic light-emitting display substrate.

In the embodiments of the present disclosure, as shown in FIG. 1c, on one hand, since the anode layer 104 is formed on the surface of the organic layer 102 away from the substrate 101 and the structure of the partition groove 103 is formed by both the anode layer 104 and the organic layer 102, an inorganic layer is no longer provided between the anode layer 104 and the organic layer 102. Therefore, compared with the foregoing related technology, with the embodiments of the present disclosure, it is possible to overcome a series of problems resulting from the inorganic layer in the related technology. On the other hand, with the embodiments of the present disclosure, the structure of the partition groove 103 may be formed after the anode layer 104, the pixel defining layer 107, and the spacer layer 108 are formed. In this way, it is possible to avoid the failure of the partition groove resulting from the manufacturing material of the pixel defining layer and/or the spacer layer remaining in the partition groove, and occurrence of a bad effect on subsequent process resulting from residual bubbles. Therefore, the structural design of the organic light-emitting display substrate of the embodiments of the present disclosure is favorable for improving the production yield.

As shown in FIG. 1c, in some embodiments, the substrate 101 is a flexible substrate, which comprises a first organic flexible layer 101a, a second organic flexible layer 101c, and a first inorganic barrier layer 101b located between the first organic flexible layer 101a and the second organic flexible layer 101c. The material of each of the first organic flexible layer 101a and the second organic flexible layer 101c comprises polyimide, and the material of the first inorganic barrier layer 101b comprises silicon nitride. Such a design can not only improve the toughness of the substrate, but also facilitate to improve the encapsulation performance of the organic light-emitting display substrate. In other embodiments of the present disclosure, the substrate may also be a hard substrate.

Figure 4A:
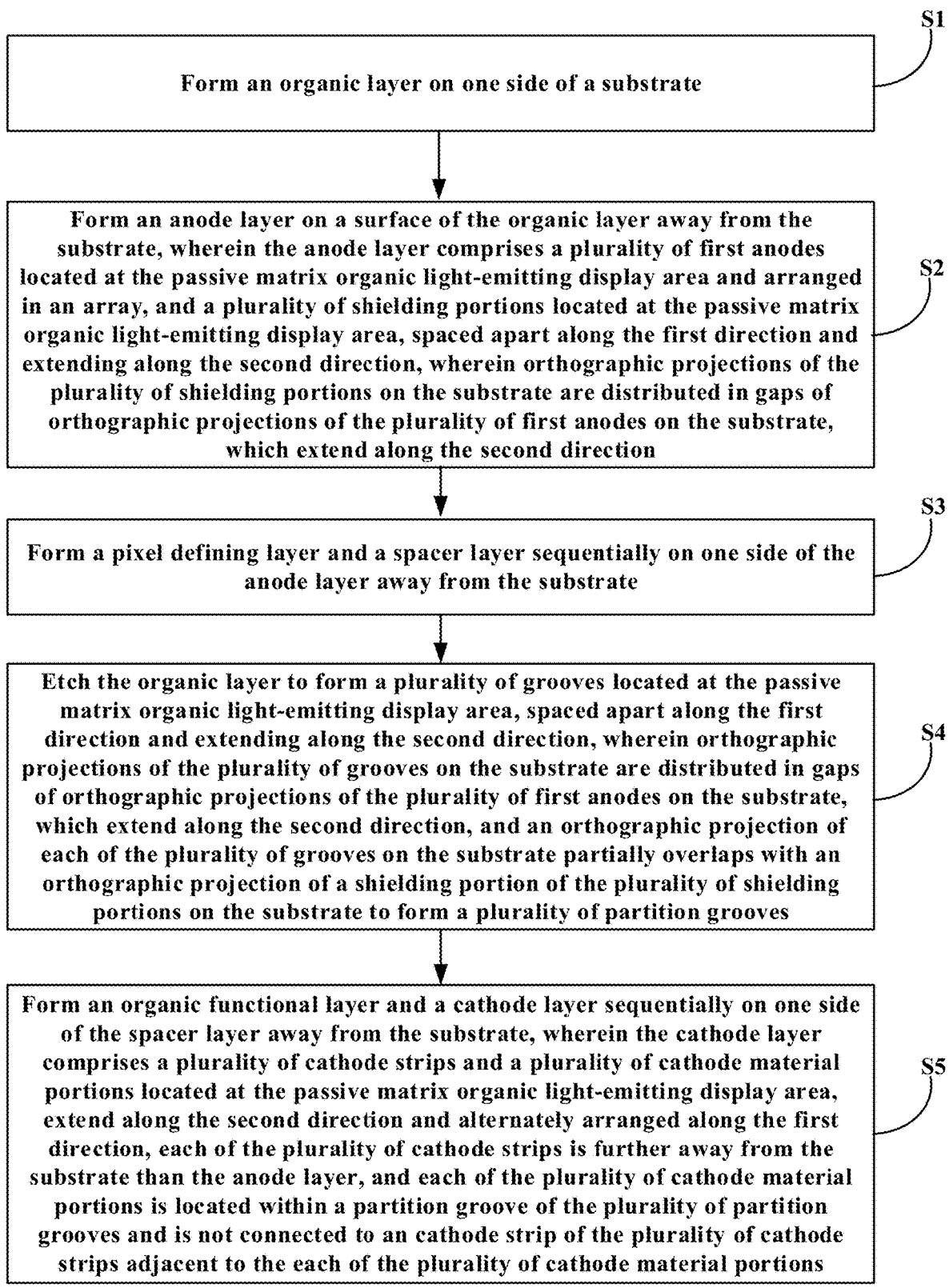
FIG. 4a is a flow chart showing a manufacturing method of an organic light-emitting display substrate according to an embodiment of the present disclosure.
Figure 4B:
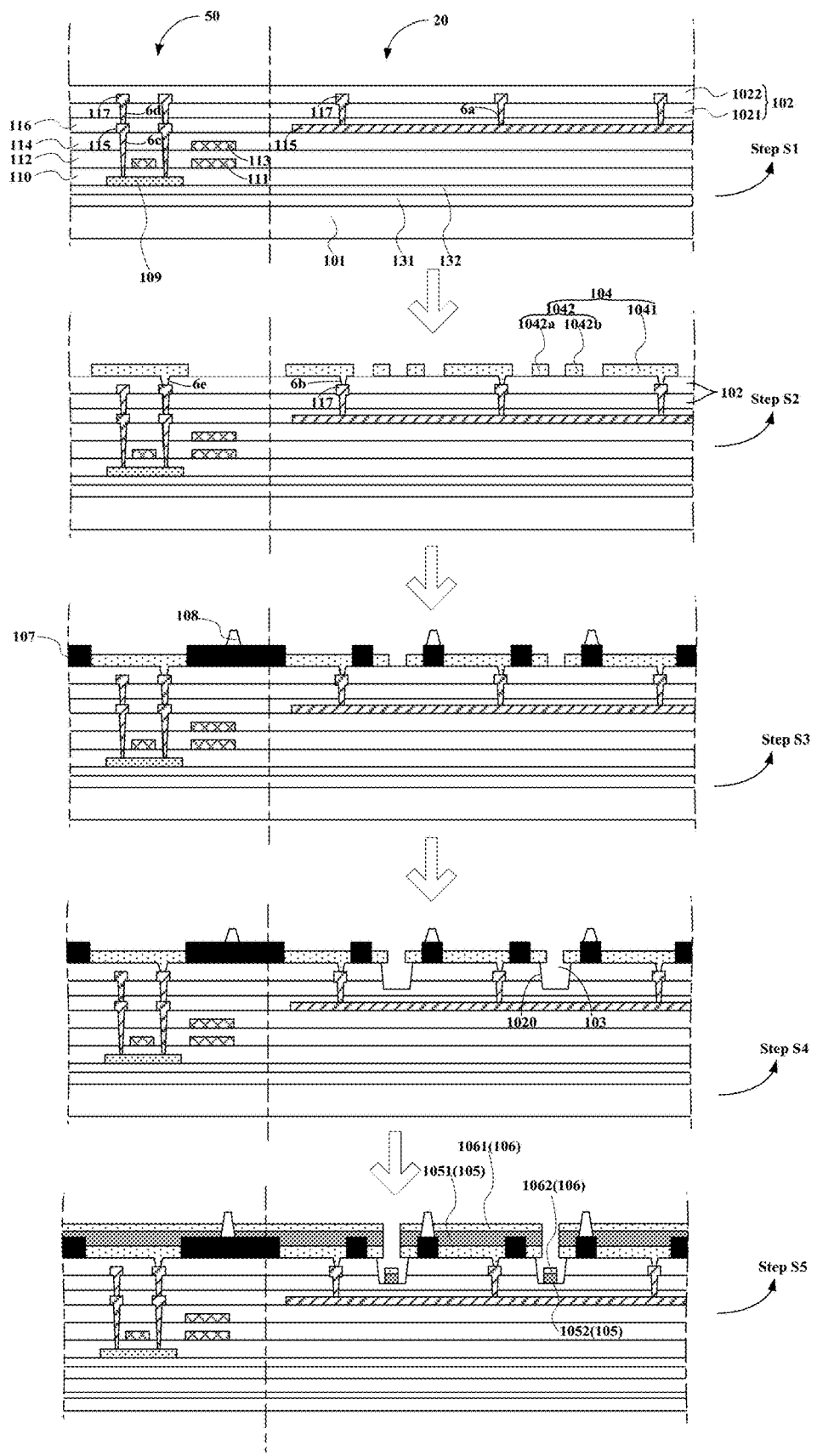
FIG. 4b shows some schematic cross-sectional views of a manufacturing process of an organic light-emitting display substrate according to an embodiment of the present disclosure.

The embodiments of the present disclosure also provide a manufacturing method of an organic light-emitting display substrate, which may be applied to manufacturing of the foregoing organic light-emitting display substrate 1 which comprises the passive matrix organic light-emitting display area 20. As shown in FIGS. 4a and 4b, the manufacturing method comprises the following steps S101 to S105.

At step S1, an organic layer 102 is formed on one side of a substrate 101.

At step S2, an anode layer 104 is formed on a surface of the organic layer 102 away from the substrate 101. The anode layer 104 comprises a plurality of first anodes 1041 located at the passive matrix organic light-emitting display area 20 and arranged in an array, and a plurality of shielding portions 1042 located at the passive matrix organic light-emitting display area 20, spaced apart along a first direction and extending along a second direction. The orthographic projections of the plurality of shielding portions 1042 on the substrate 101 are distributed in gaps of the orthographic projections of the plurality of first anodes 1041 on the substrate 101. The gaps extend along the second direction.

At step S3, a pixel defining layer 107 and a spacer layer 108 are formed sequentially on one side of the anode layer 104 away from the substrate 101.

At step S4, the organic layer 102 is etched to form a plurality of grooves 1020 located at the passive matrix organic light-emitting display area 20 and extending along the second direction. The orthographic projections of the plurality of grooves 1020 on the substrate 101 are distributed in the gaps of the orthographic projections of the plurality of first anodes 1041 on the substrate 101, the gaps extending along the second direction. Moreover, the orthographic projection of each groove 1020 on the substrate 101 partially overlaps with the orthographic projection of a shielding portion 1042 on the substrate 101 to form a partition groove 103.

At step S5, an organic functional layer 105 and a cathode layer 106 are formed sequentially on one side of the spacer layer 108 away from the substrate 101. The cathode layer 106 comprises a plurality of cathode strips 1061 and a plurality of cathode material portions 1062. The plurality of cathode strips 1061 and the plurality of cathode material portions 1062 are located at the passive matrix organic light-emitting display area 20, extend along the second direction and are alternately arranged along the first direction. Each cathode strip 1061 is further away from the substrate 101 than the anode layer 104, and each cathode material portion 1062 is located within a partition groove 103 and is not connected to a cathode strip 1061 adjacent to this cathode material portion 1062.

In some embodiments of the present disclosure, after the organic functional layer 105 is formed at step S5, the organic functional layer 105 is also discontinuous by being partitioned by the partition groove. As shown in FIG. 4b, the organic functional layer 105 comprises a plurality of first portions 1051 located at the passive matrix organic light-emitting display area 20 and a plurality of second portions 1052 located at the passive matrix organic light-emitting display area 20. Each first portion 1051 is further away from the substrate 101 than the anode layer 104, and each second portion 1052 is located within a partition groove 103 and is not connected to a first portion 1051 adjacent to this second portion 1052.

In some embodiments of the present disclosure, the substrate 101 is a flexible substrate and is formed on a glass substrate in advance (not shown). For example, a first organic flexible layer, a first inorganic barrier layer, and a second organic flexible layer are formed sequentially on one side of the glass substrate. The first organic flexible layer, the first inorganic barrier layer, and the second organic flexible layer as whole are the substrate of the organic light-emitting display substrate. The glass substrate produces a supporting effect during the manufacturing process of the organic light-emitting display substrate. After the manufacturing of the structure of the organic light-emitting display substrate is completed, the glass substrate is peeled off from the substrate to support the flexible characteristics of the organic light-emitting display substrate.

As shown in FIG. 4b, the above step of forming the organic layer 102 comprises forming a first organic layer 1021 and a second organic layer 1022 sequentially on one side of the substrate 101. In some embodiments, the groove 1020 penetrates through the second organic layer 1022 and extends into the first organic layer 1021. In other embodiments, the groove 1020 may not penetrate through the second organic layer 1022, that is, may stop within the second organic layer 1022. On such basis, the manufacturing method of the organic light-emitting display substrate further comprises following steps.

A first data metal layer 115 and a first inorganic layer 116 are formed sequentially on one side of the substrate 101 before the first organic layer 1021 is formed.

A second data metal layer 117 on one side of the first organic layer 1021 away from the substrate 101 is formed after the first organic layer 1021 is formed and before the second organic layer 1022 is formed. In the passive matrix organic light-emitting display area 20, the second data metal layer 117 is connected to the first data metal layer 115 through a plurality of first via holes 6a, and connected to the anode layer 104 through a plurality of second via holes 6b. Any two first anodes 1041 adjacent to each other along the first direction are connected to each other through the first data metal layer 115 or the second data metal layer 117.

As shown in FIG. 4b, other than the passive matrix organic light-emitting display area 20, the manufactured organic light-emitting display substrate also comprises an active matrix organic light-emitting display area 50. The manufacturing method of the organic light-emitting display substrate further comprises following step.

A semiconductor layer 109, a first insulating layer 110, a first gate metal layer 111, a second insulating layer 112, a second gate metal layer 113, a second gate metal layer 113 and a third insulating layer 114 are formed sequentially on one side of the substrate 101 before the first data metal layer 115 is formed. In the active matrix organic light-emitting display area 50, the first data metal layer 115 is connected to the semiconductor layer 109 through a plurality of third via holes 6c, the second data metal layer 117 is connected to the first data metal layer 115 through a plurality of fourth via holes 6d, and the anode layer 104 is connected to the second data metal layer 117 through a plurality of fifth via holes 6e.

Figure 5A:
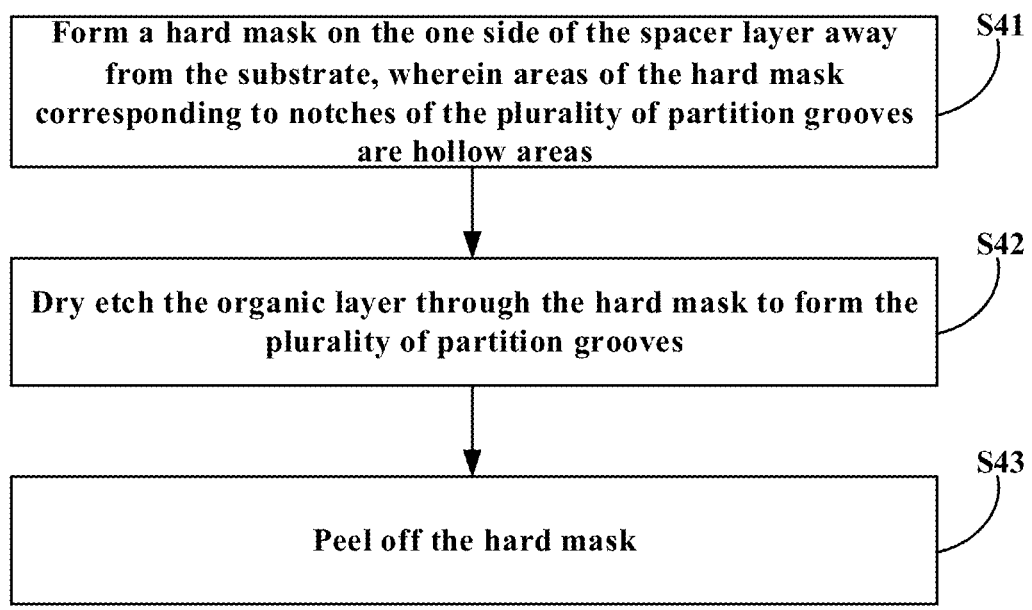
FIG. 5a is a flow chart showing a manufacturing method of a partition groove according to an embodiment of the present disclosure.
Figure 5B:
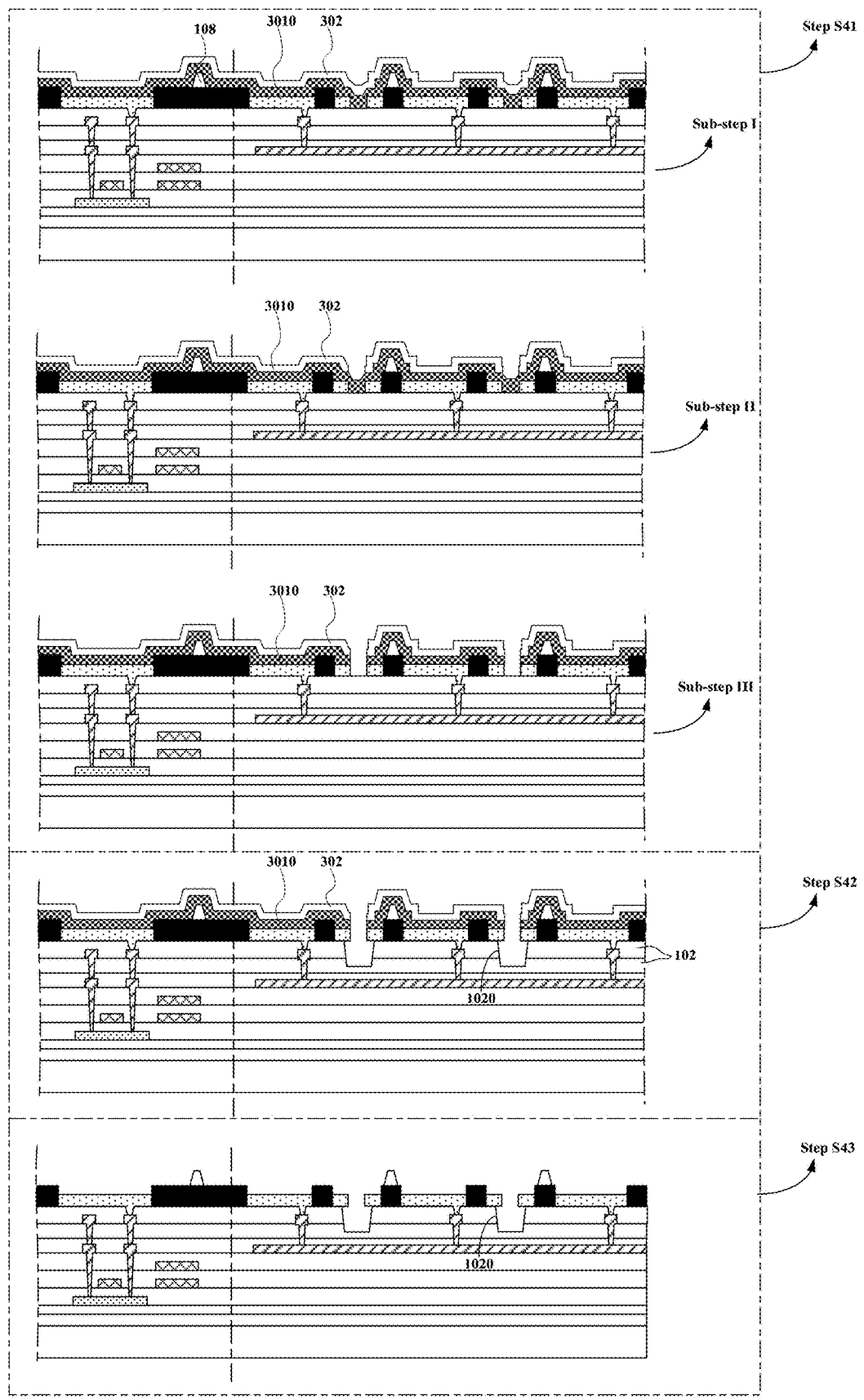
FIG. 5b shows some schematic cross-sectional views of a manufacturing process of an organic light-emitting display substrate according to an embodiment of the present disclosure.

As shown in FIGS. 5a and 5b, in some embodiments of the present disclosure, the step of etching the organic layer comprises the following steps S41 to S43.

At step S41, a hard mask is formed on one side of the spacer layer away from the substrate. An area of the hard mask corresponding to notch of the partition groove has is hollow area. The material type of the hard mask is not limited. In some embodiments, the material of the hard mask comprises metal oxides such as indium gallium zinc oxide.

As shown in FIG. 5b, in some embodiments, the step S41 specifically comprises following sub-steps.

Sub-step I: a hard mask cover layer 3010 and a photoresist cover layer 302 are formed sequentially on one side of the spacer layer 108 away from the substrate 101.

Sub-step II: the photoresist cover layer 302 is exposed and developed sequentially to obtain a photoresist protection mask. An area of the photoresist protection mask corresponding to notch of the partition groove is hollow area.

Sub-step III: the hard mask cover layer 3010 is wet etched through the photoresist protective mask to obtain the hard mask.

At step S42, the organic layer 102 is dry etched through the hard mask to form the plurality of grooves 1020.

At step S43, the hard mask is peeled off.

As mentioned above, since the anode layer is formed on the surface of the organic layer away from the substrate, the structure of the partition groove is formed by both the anode layer and the organic layer, and an inorganic layer is no longer provided between the anode layer and the organic layer. Therefore, compared with the foregoing related art, with the manufacturing method of the organic light-emitting display substrate of the embodiments of the present disclosure, it is possible to overcome a series of manufacturing problems resulting from the inorganic layer in the related art. In addition, the etching step for forming the partition groove is performed after the anode layer, the pixel defining layer, and the spacer layer are formed. Compared with the foregoing related technology, it is possible to avoid the failure of the partition groove resulting from the manufacturing material of the pixel defining layer and/or the spacer layer remaining in the partition groove, and the occurrence of bad effect on subsequent process resulting from residual bubbles. Therefore, with the manufacturing method of the organic light-emitting display substrate of the embodiments of the present disclosure, it is favorable for improving the production yield.

Figure 6:
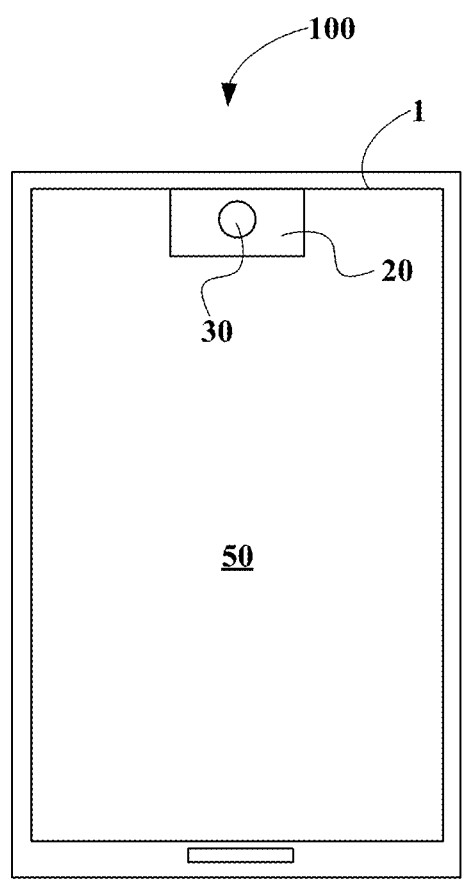
FIG. 6 is a front view showing an organic light-emitting display device according to an embodiment of the present disclosure.

As shown in FIG. 6, the embodiments of the present disclosure also provide an organic light-emitting display device 100 which comprises the organic light-emitting display substrate 1 of any of the foregoing embodiments.

In some embodiments, the organic light-emitting display substrate 1 comprises a passive matrix organic light-emitting display area 20 and a active matrix organic light-emitting display area 50. The organic light-emitting display device 100 further comprises at least one functional device 30. The orthographic projection of the at least one functional device 30 on the display substrate 1 is located at the passive matrix organic light-emitting display area 20. The functional device 30 is not limited to a specific type, for example is a camera or a distance sensor.

The specific product types of the above organic light-emitting display devices comprise, but are not limited to, a mobile phone, a tablet computer, a notebook computer, a wearable device, an electronic paper or a display screen, and the like.

Since the organic light-emitting display substrate has the above beneficial effects, the organic light-emitting display device also has the above beneficial effects and higher production yield.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. An organic light-emitting display substrate comprising a passive matrix organic light-emitting display area, the organic light-emitting display substrate comprising:
   a substrate;
   an organic layer located on one side of the substrate, and comprising a plurality of grooves located at the passive matrix organic light-emitting display area, spaced apart along a first direction and extending along a second direction;
   an anode layer located on a surface of the organic layer away from the substrate, and comprising:
   a plurality of first anodes located at the passive matrix organic light-emitting display area and arranged in an array, and
   a plurality of shielding portions located at the passive matrix organic light-emitting display area, spaced apart along the first direction and extending along the second direction, wherein materials of the plurality of shielding portions are the same as materials of the plurality of first anodes, orthographic projections of the plurality of shielding portions on the substrate and orthographic projections of the plurality of grooves on the substrate are distributed in gaps of orthographic projections of the plurality of first anodes on the substrate, which extend along the second direction, and an orthographic projection of each of the plurality of shielding portions on the substrate partially overlaps with an orthographic projection of a groove of the plurality of grooves on the substrate to form a plurality of partition grooves;
   an organic functional layer located on one side of the anode layer away from the substrate; and
   a cathode layer located on one side of the organic functional layer away from the substrate, and comprising a plurality of cathode strips and a plurality of cathode material portions, wherein the plurality of cathode strips and the plurality of cathode material portions are located at the passive matrix organic light-emitting display area, extend along the second direction and are alternately arranged along the first direction, each of the plurality of cathode strips is further away from the substrate than the anode layer, and each of the plurality of cathode material portions is located within a partition groove of the plurality of partition grooves and is not connected to an cathode strip of the plurality of cathode strips adjacent to the each of the plurality of cathode material portions,
   wherein in the passive matrix organic light-emitting display area, any two of the plurality of first anodes adjacent to each other along the first direction are connected to each other through a first data metal layer or a second data metal layer, wherein the second data metal layer is connected to the first data metal layer through a plurality of first via holes and connected to the anode layer through a plurality of second via holes.

2. The organic light-emitting display substrate according to claim 1, wherein the organic functional layer comprises a plurality of first portions located at the passive matrix organic light-emitting display area and a plurality of second portions located at the passive matrix organic light-emitting display area, wherein each of the plurality of first portions is further away from the substrate than the anode layer, and each of the plurality of second portions is located within a partition groove of the plurality of partition grooves and is not connected to a first portion of the plurality of first portions adjacent to the each of the plurality of second portions.

3. The organic light-emitting display substrate according to claim 1, wherein each of the plurality of shielding portions comprises two shielding strips located on both sides of the groove and spaced apart from each other, and an orthographic projection of each of the two shielding strips on the substrate partially overlaps with the orthographic projection of the groove on the substrate.

4. The organic light-emitting display substrate according to claim 3, further comprising a first inorganic layer, a pixel defining layer and a spacer layer on the one side of the substrate, wherein:
   the organic layer comprises a first organic layer and a second organic layer; and
   the first data metal layer, the first inorganic layer, the first organic layer, the second data metal layer, the second organic layer, the anode layer, the pixel defining layer, the spacer layer, the organic functional layer and the cathode layer are arranged sequentially along a direction away from the substrate.

5. The organic light-emitting display substrate according to claim 4, wherein each of the plurality of grooves penetrates through the second organic layer and extends into the first organic layer.

6. The organic light-emitting display substrate according to claim 4, wherein an orthographic projection of each of the plurality of grooves on the substrate has a width of 5 microns to 10 microns along the first direction and/or wherein each of the plurality of grooves on the substrate has a depth of 2 micrometers to 2.5 micrometers along a direction perpendicular to the substrate.

7. The organic light-emitting display substrate according to claim 4, wherein an angle between each of two side walls and a bottom wall of each of the plurality of grooves is 120 degrees to 140 degrees.

8. The organic light-emitting display substrate according to claim 4, wherein a portion of the orthographic projection of each of the two shielding strips on the substrate overlapping with the orthographic projection of the groove on the substrate has a width of 0.8 micron to 1 micron along the first direction.

9. The organic light-emitting display substrate according to claim 4, further comprising an active matrix organic light-emitting display area, the organic light-emitting display substrate further comprising a semiconductor layer, a first insulating layer, a first gate metal layer, a second insulating layer, a second gate metal layer and a third insulating layer which are located between the substrate and the first data metal layer and arranged sequentially along the direction away from the substrate, wherein:
   in the active matrix organic light-emitting display area, the first data metal layer is connected to the semiconductor layer through a plurality of third via holes and connected to the second data metal layer through a plurality of fourth via holes, and the anode layer is connected to the second data metal layer through a plurality of fifth via holes.

10. The organic light-emitting display substrate according to claim 9, wherein the active matrix organic light-emitting display area surrounds a portion of an edge of the passive matrix organic light-emitting display area; or the active matrix organic light-emitting display area surrounds the edge of the passive matrix organic light-emitting display area.

11. The organic light-emitting display substrate according to claim 1, wherein the substrate comprises a first organic flexible layer, a second organic flexible layer, and a first inorganic barrier layer located between the first organic flexible layer and the second organic flexible layer.

12. An organic light-emitting display device, comprising the organic light-emitting display substrate according to claim 1.

13. The organic light-emitting display device according to claim 12, wherein:
the organic light-emitting display substrate further comprises an active matrix organic light-emitting display area; and
the organic light-emitting display device further comprises at least one functional device, an orthographic projection of which on the organic light- emitting display substrate is located at the passive matrix organic light-emitting display area.

14. A manufacturing method of an organic light-emitting display substrate comprising a passive matrix organic light-emitting display area, the manufacturing method comprising:
forming an organic layer on one side of a substrate;
forming an anode layer on a surface of the organic layer away from the substrate, wherein the anode layer comprises
a plurality of first anodes located at the passive matrix organic light- emitting display area and arranged in an array, and
a plurality of shielding portions located at the passive matrix organic light-emitting display area, spaced apart along a first direction and extending along a second direction, wherein materials of the plurality of shielding portions are the same as materials of the plurality of first anodes, orthographic projections of the plurality of shielding portions on the substrate are distributed in gaps of orthographic projections of the plurality of first anodes on the substrate, which extend along the second direction;
forming a pixel defining layer and a spacer layer sequentially on one side of the anode layer away from the substrate;
etching, after forming the pixel defining layer and the spacer layer, the organic layer to form a plurality of grooves located at the passive matrix organic light- emitting display area, spaced apart along the first direction and extending along the second direction, wherein orthographic projections of the plurality of grooves on the substrate are distributed in gaps of orthographic projections of the plurality of first anodes on the substrate, which extend along the second direction, and an orthographic projection of each of the plurality of grooves on the substrate partially overlaps with an orthographic projection of a shielding portion of the plurality of shielding portions on the substrate to form a plurality of partition grooves; and forming an organic functional layer and a cathode layer sequentially on one side of the spacer layer away from the substrate, wherein the cathode layer comprises a plurality of cathode strips and a plurality of cathode material portions, the plurality of cathode strips and the plurality of cathode material portions are located at the passive matrix organic light-emitting display area, extend along the second direction and are alternately arranged along the first direction, each of the plurality of cathode strips is further away from the substrate than the anode layer, and each of the plurality of cathode material portions is located within a partition groove of the plurality of partition grooves and is not connected to an cathode strip of the plurality of cathode strips adjacent to the each of the plurality of cathode material portions,
wherein in the passive matrix organic light-emitting display area, any two of the plurality of first anodes adjacent to each other along the first direction are connected to each other through a first data metal layer or a second data metal layer, wherein the second data metal layer is connected to the first data metal layer through a plurality of first via holes and connected to the anode layer through a plurality of second via holes.

15. The manufacturing method according to claim 14, wherein etching the organic layer comprises:
forming a hard mask on the one side of the spacer layer away from the substrate, wherein areas of the hard mask corresponding to notches of the plurality of partition grooves are hollow areas;
dry etching the organic layer through the hard mask to form the plurality of partition grooves; and
peeling off the hard mask.

16. The manufacturing method according to claim 15, wherein forming the hard mask comprises:
forming a hard mask cover layer and a photoresist cover layer sequentially on the one side of the spacer layer away from the substrate;
exposing and developing the photoresist cover layer sequentially to obtain a photoresist protection mask, wherein areas of the photoresist protection mask corresponding to the notches of the plurality of partition grooves are hollow areas; and
wet etching the hard mask cover layer through the photoresist protective mask to obtain the hard mask.

17. The manufacturing method according to claim 14, wherein forming the organic layer comprises forming a first organic layer and a second organic layer sequentially on the one side of the substrate, and the manufacturing method further comprises:
forming the first data metal layer and a first inorganic layer sequentially on the one side of the substrate before forming the first organic layer; and
forming the second data metal layer on one side of the first organic layer away from the substrate after forming the first organic layer and before forming the second organic layer.

18. The manufacturing method according to claim 17, wherein each of the plurality of grooves penetrates through the second organic layer and extends into the first organic layer.

19. The manufacturing method according to claim 17, wherein the organic light-emitting display substrate further comprises an active matrix organic light-emitting display area, and the manufacturing method further comprises:

forming a semiconductor layer, a first insulating layer, a first gate metal layer, a second insulating layer, a second gate metal layer, and a third insulating layer sequentially on the one side of the substrate before forming the first data metal layer, wherein in the active matrix organic light-emitting display area, the first data metal layer is connected to the semiconductor layer through a plurality of third via holes and connected to the second data metal layer through a plurality of fourth via holes, and the anode layer is connected to the second data metal layer through a plurality of fifth via holes.

20. An organic light-emitting display substrate comprising a passive matrix organic light-emitting display area, the organic light-emitting display substrate comprising:
    a substrate;
    an organic layer located on one side of the substrate, and comprising a plurality of grooves located at the passive matrix organic light-emitting display area, spaced apart along a first direction and extending along a second direction;
    an anode layer located on a surface of the organic layer away from the substrate, and comprising:
    a plurality of first anodes located at the passive matrix organic light-emitting display area and arranged in an array, and
    a plurality of shielding portions located at the passive matrix organic light-emitting display area, spaced apart along the first direction and extending along the second direction, wherein materials of the plurality of shielding portions are the same as materials of the plurality of first anodes, orthographic projections of the plurality of shielding portions on the substrate and orthographic projections of the plurality of grooves on the substrate are distributed in gaps of orthographic projections of the plurality of first anodes on the substrate, which extend along the second direction, and an orthographic projection of each of the plurality of shielding portions on the substrate partially overlaps with an orthographic projection of a groove of the plurality of grooves on the substrate to form a plurality of partition grooves;
    an organic functional layer located on one side of the anode layer away from the substrate; and
    a cathode layer located on one side of the organic functional layer away from the substrate, and comprising a plurality of cathode strips and a plurality of cathode material portions, wherein the plurality of cathode strips and the plurality of cathode material portions are located at the passive matrix organic light-emitting display area, extend along the second direction and are alternately arranged along the first direction, each of the plurality of cathode strips is further away from the substrate than the anode layer, and each of the plurality of cathode material portions is located within a partition groove of the plurality of partition grooves and is not connected to an cathode strip of the plurality of cathode strips adjacent to the each of the plurality of cathode material portions;
    the organic light-emitting display substrate further comprising a first data metal layer, a first inorganic layer, a second data metal layer, a pixel defining layer and a spacer layer on the one side of the substrate, wherein:
    the organic layer comprises a first organic layer and a second organic layer;
    the first data metal layer, the first inorganic layer, the first organic layer, the second data metal layer, the second organic layer, the anode layer, the pixel defining layer, the spacer layer, the organic functional layer and the cathode layer are arranged sequentially along a direction away from the substrate; and
    in the passive matrix organic light-emitting display area, the second data metal layer is connected to the first data metal layer through a plurality of first via holes and connected to the anode layer through a plurality of second via holes, and any two of the plurality of first anodes adjacent to each other along the first direction are connected to each other through the first data metal layer or the second data metal layer.

* * * * *